(12) United States Patent
Feiweier

(10) Patent No.: US 7,403,002 B2
(45) Date of Patent: Jul. 22, 2008

(54) METHOD AND APPARATUS FOR REDUCTION OF NYQUIST GHOSTS IN MEDICAL MAGNETIC RESONANCE IMAGING

(75) Inventor: Thorsten Feiweier, Poxdorf (DE)

(73) Assignee: Siemens Aktiengesellschaft, Munich (DE)

( * ) Notice: Subject to any disclaimer, the term of this patent is extended or adjusted under 35 U.S.C. 154(b) by 21 days.

(21) Appl. No.: 11/510,178

(22) Filed: Aug. 25, 2006

(65) Prior Publication Data

US 2007/0055137 A1 Mar. 8, 2007

(30) Foreign Application Priority Data

Aug. 26, 2005 (DE) .................. 10 2005 040 548

(51) Int. Cl.
*G01V 3/00* (2006.01)
(52) U.S. Cl. .................................................. 324/307
(58) Field of Classification Search ......... 324/300–322; 600/410–435
See application file for complete search history.

(56) References Cited

U.S. PATENT DOCUMENTS

| 5,672,969 A * | 9/1997 | Zhou et al. .......... 324/309 |
| 5,680,045 A | 10/1997 | Feinberg | |
| 5,869,965 A * | 2/1999 | Du et al. .......... 324/309 |
| 5,923,168 A * | 7/1999 | Zhou et al. .......... 324/309 |
| 6,064,205 A * | 5/2000 | Zhou et al. .......... 324/309 |
| 6,320,380 B1 | 11/2001 | Wu et al. | |

OTHER PUBLICATIONS

"Ghost Cancellation Algorithms for MRI Images," Zakhor, IEEE Trans. on Med. Imaging, vol. 9, No. 3 (Sep. 1990), pp. 318-326.
"A Method of Generalized Projections (MGP) Ghost Correction Algorithm for Interleaved EPI," Lee et al, IEEE Trans. on Med. Imaging, vol. 23, No. 7 (Jul. 2004) pp. 839-848.

* cited by examiner

*Primary Examiner*—Brij B. Shrivastav
*Assistant Examiner*—Dixomara Vargas
(74) *Attorney, Agent, or Firm*—Schiff Hardin LLP

(57) ABSTRACT

In a method and MRT apparatus for reduction of Nyquist ghosts in medical magnetic resonance imaging given the application of EPI sequences of one or more progression curves with regard to one or more characterizing quantities of the EPI echo, is determined dependent on the echo number of a readout gradient pulse train defined by pulse shape, pulse amplitude and pulse duration, an EPI measurement is implemented with a readout gradient pulse train, composed of alternating positive and negative amplitudes with under which alternating positive and negative echoes and respectively readout, and a phase coding gradient, so a phase-coded data set is acquired, the phase-coded data set is corrected on the basis of the progression curves, and is Fourier-transformed the corrected data set, to obtain an artifact-reduced (with regard to the Nyquist ghosts) image data set.

19 Claims, 7 Drawing Sheets

FIG 2
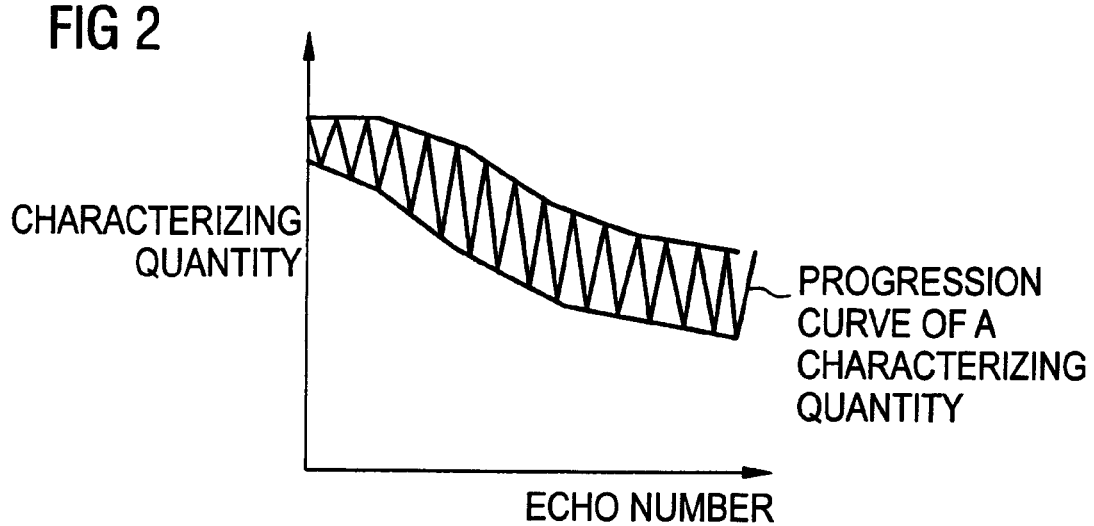
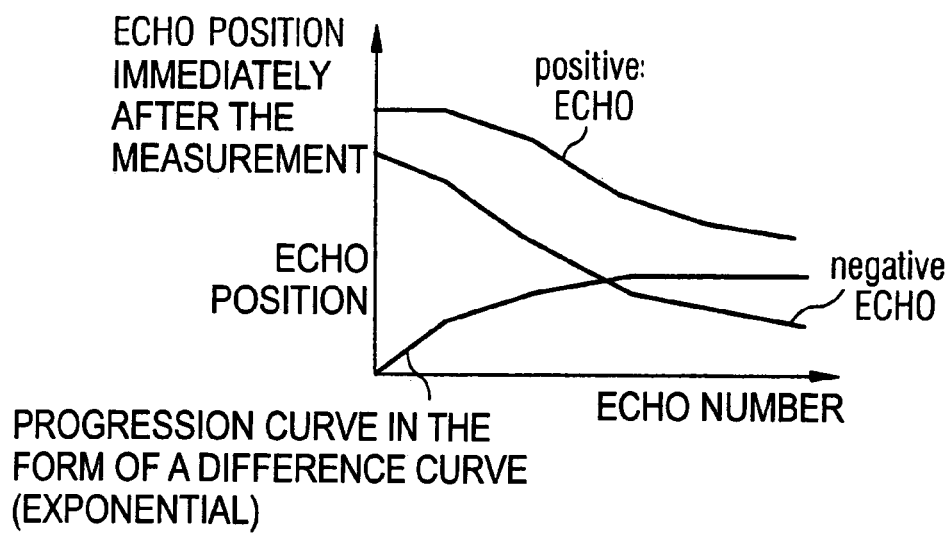
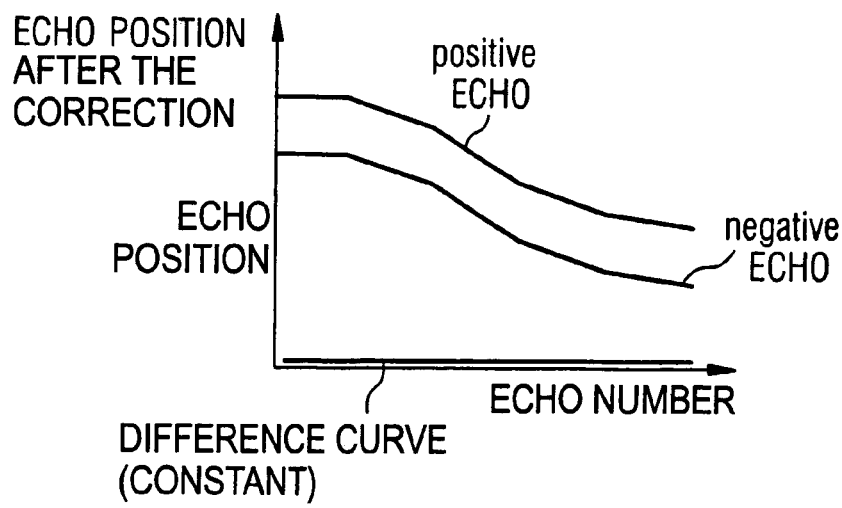

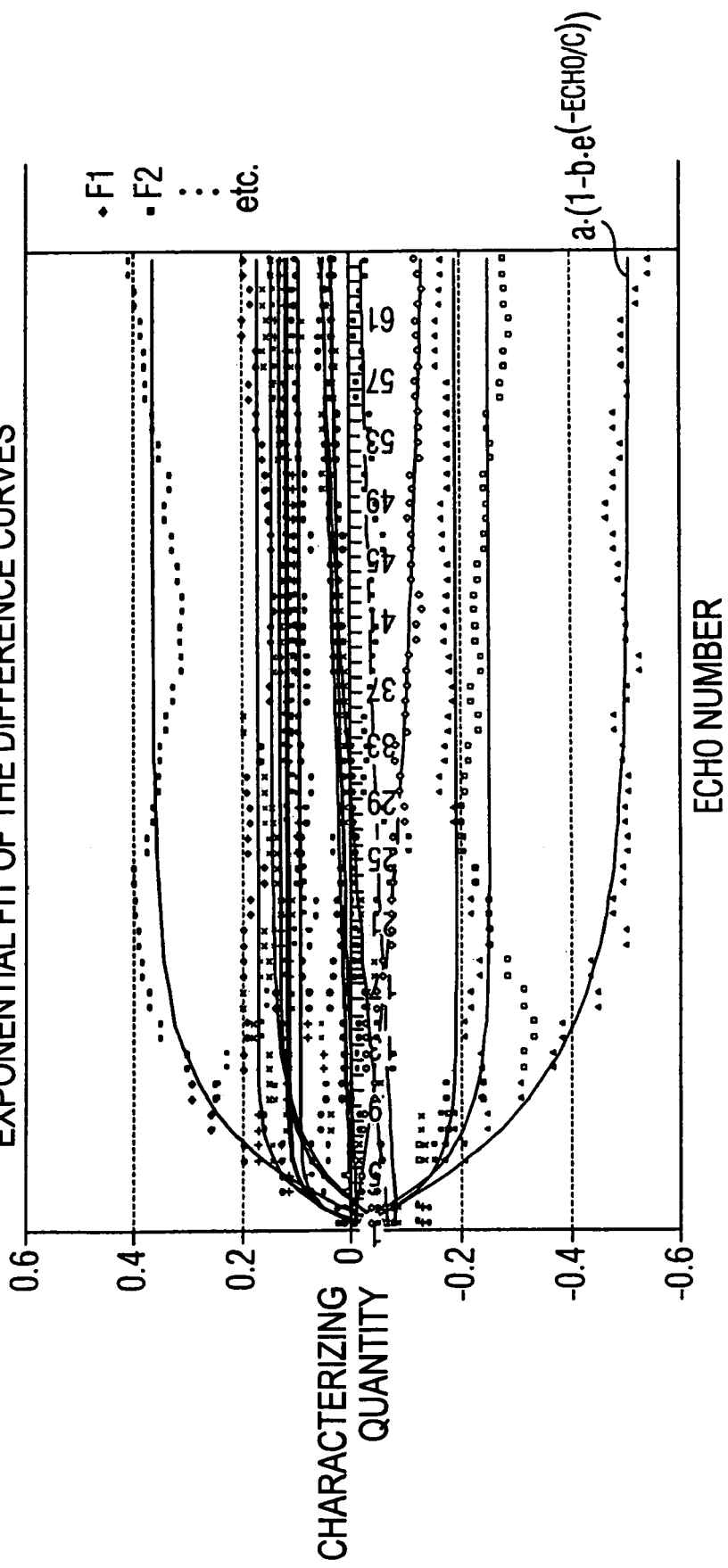

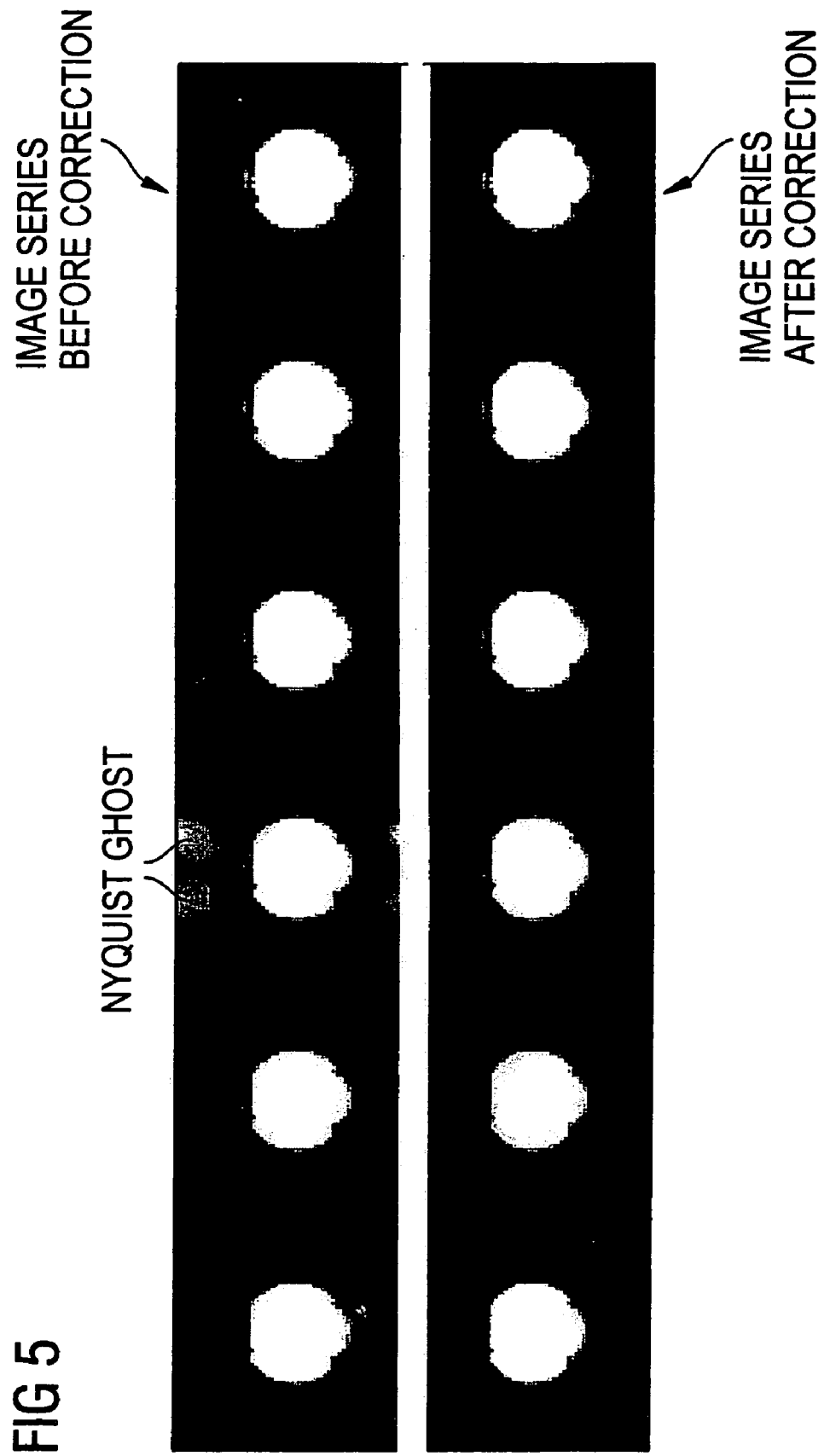

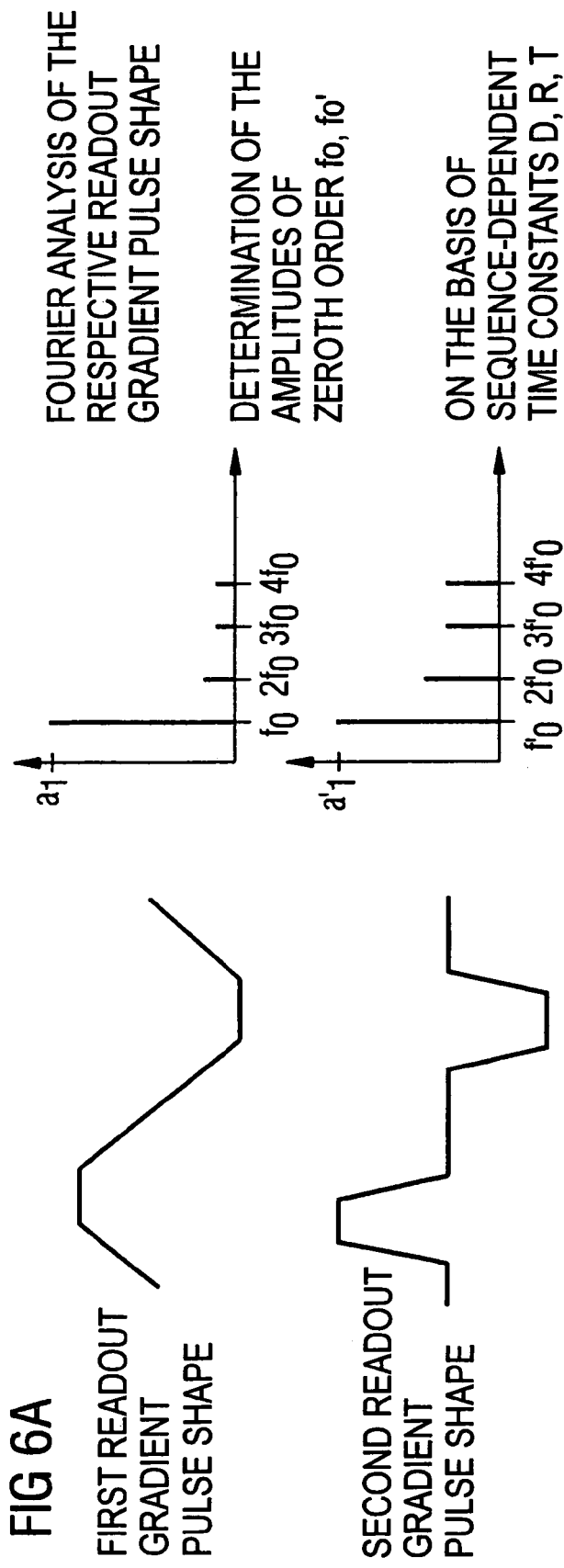

FIG 6A
FIRST READOUT GRADIENT PULSE SHAPE

SECOND READOUT GRADIENT PULSE SHAPE

FOURIER ANALYSIS OF THE RESPECTIVE READOUT GRADIENT PULSE SHAPE

DETERMINATION OF THE AMPLITUDES OF ZEROTH ORDER $f_0$, $f_o'$

ON THE BASIS OF SEQUENCE-DEPENDENT TIME CONSTANTS D, R, T

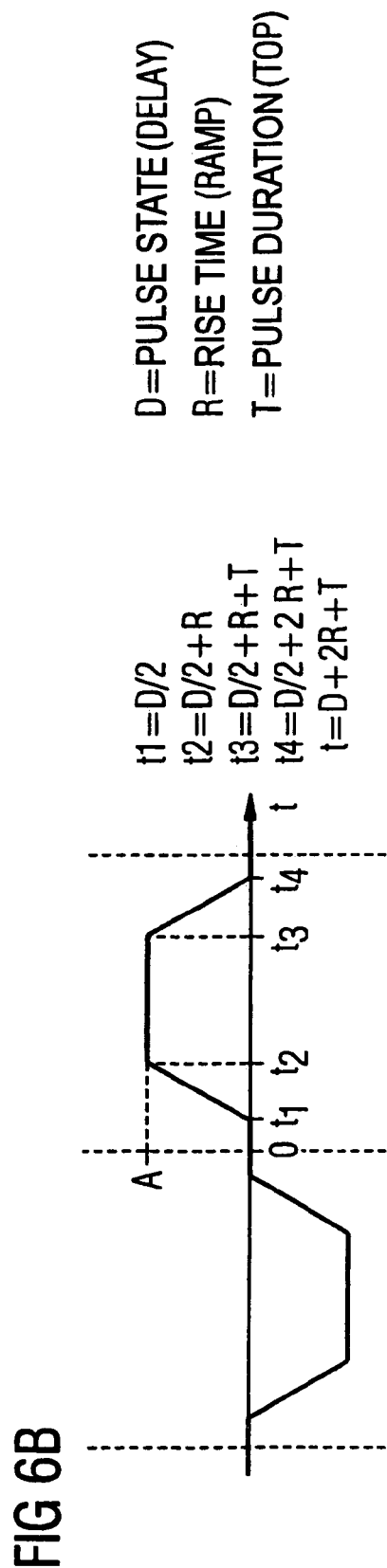

FIG 6B

D = PULSE STATE (DELAY)
R = RISE TIME (RAMP)
T = PULSE DURATION (TOP)

$t_1 = D/2$
$t_2 = D/2 + R$
$t_3 = D/2 + R + T$
$t_4 = D/2 + 2R + T$
$t = D + 2R + T$

IMAGE-BASED OPTIMIZATION ON THE BASIS OF AN AUTO-CORRELATION FUNCTION A $$A = \sum_i^N \sum_j^N \begin{cases} B[i,j] \cdot B\left[i, j+\frac{N}{2}\right] & \text{for } j+\frac{N}{2} \leq N \\ B[i,j] \cdot B\left[i, j-\frac{N}{2}\right] & \text{otherwise} \end{cases}$$

METHOD AND APPARATUS FOR REDUCTION OF NYQUIST GHOSTS IN MEDICAL MAGNETIC RESONANCE IMAGING

BACKGROUND OF THE INVENTION

1. Field of the Invention

The present invention generally concerns magnetic resonance tomography (MRT) as used in medicine for examination of patients. The present invention in particular concerns a method and an MRT apparatus for reduction of Nyquist ghosts (also called N/2 ghosts) that appear upon application of echo-planar imaging sequences (EPI sequences) and impair the image quality (and therewith the diagnosis) to a significant degree.

2. Description of the Prior Art

MRT is based on the physical phenomenon of nuclear magnetic resonance and has been successfully used as an imaging modality in medicine and biophysics for over 15 years. In this examination modality the subject is exposed to a strong, constant magnetic field. The nuclear spins of the atoms in the subject, which were previously randomly oriented, thereby align. Radio-frequency energy can now excite these "ordered" nuclear spins to a precession movement. This precession generates the actual measurement signal in MRT, this measurement signal being acquired by suitable reception coils. The measurement subject can be spatially coded in all three spatial directions by non-inhomogeneous magnetic fields generated by gradient coils.

In one possible method for generation of MRT images, a slice is, for example, initially excited in the z-direction. The coding of the spatial information in the slice ensues by combined phase and frequency coding by means of two orthogonal gradient fields that (in the examination of a slice excited in the z-direction) are generated in the x-direction and y-direction by the gradient coils. The imaging sequence is repeated M times for various values of the phase coding gradients (for example $G^y$), and the magnetic resonance signal is digitized and stored N times in the presence of the readout gradient $G^x$ for each sequence pass. In this manner a number matrix (matrix in k-space) is generated containing N×M data points. An MR image of the slice in question with a resolution of N×M pixels can be directly reconstructed from this raw data set by a two-dimensional Fourier transformation.

In a technique known as echo-planar imaging (EPI), a number of phase-coded echoes are used to fill the raw data matrix. The basic idea of this technology is to generate a series of echoes in the readout gradient ($G^x$) after an individual (selective) RF excitation, the echoes being associated with various lines in k-space matrix by a suitable modulation of the phase coding gradients ($G^y$).

One possible form of the echo-planar pulse sequence is shown in FIG. 1A. After an excitation pulse and a refocusing pulse multiple gradient echoes are generated via a sinusoidally-oscillating frequency coding gradient in the readout direction and phase coding. The phase coding ensues in this representation via small gradient-pulses (blips) in the range of the zero crossings of the oscillating frequency coding gradients and leads in this manner to a serpentine pass through the spatial frequency matrix (k-matrix) as is shown in FIG. 1B.

Despite of many limitations, EPI sequences show a high clinical potential (particularly in functional imaging and in perfussion and diffusion measurements) since movement artifacts (for example due to respiration or pulsing movement of blood or of cerebral fluid) can be drastically reduced due to the extremely short measurement time (MR image acquisition in less than 100 ms).

Unwanted artifacts also occur in EPI imaging that, as what are known as Nyquist ghosts (or also called "N/2 ghosts"), which make an image assessment or image interpretation more difficult in the framework of a diagnosis.

This type of image interference causes the actual image information to be displaced in both directions by half of the phase coding steps and shown a second time as an "image ghost" that even overlaps the actual image in part. An example of such an image afflicted with a Nyquist ghost is shown in FIG. 3.

The cause of Nyquist ghosts is based on all possible forms of asymmetries between the echoes occurring due to positive and negative gradient pulses of the alternating readout gradient pulse train. Such echoes, for example, originate from eddy currents or gradient distortions. Examinations of the dependency of the Nyquist ghosts on protocol parameters have ultimately identified the echo-echo interval of the readout gradient pulse train (and therewith the frequency of the gradient pulse alternation) as a significant parameter. This is also the reason why strong Nyquist ghosts with ghost-to-signal ratios of more than 20% are observed in the proximity of resonance phenomena of the MR scanner (for example given acoustic resonances of the gradient coil or of the cryoshield).

In order to compensate for unavoidable, system-intrinsic asymmetries, data for phase correction are also acquired in addition to the actual image data, with which image data separated into even and odd k-space lines can be corrected before the Fourier transformation. Insofar as the asymmetries occurring in the later readout train are already present in identical form during the phase correction exposure, the Nyquist ghost can be eliminated in the ideal case.

For EPI imaging two strategies for phase correction are prevalent in the prior art:

A) Before the actual image acquisition the entire EPI readout gradient pulse train is initially acquired without phase coding, meaning that the blips are omitted and a dimensional projection of the image subject to be examined is acquired. The information thereby acquired with regard to the displacement of the echo positions and echo phases is subsequently evaluated and used later for correction of the subsequent actual (two-dimensional) image acquisition. This method has the advantage that effects can be detected that only dynamically build up over time during the EPI readout pulse train (for example building resonance phenomena).

A disadvantage of this known technique is that a complete additional exposure that extends (in the worst case doubles) the measurement time is necessary for each measurement. Given a longer acquisition series (for example 1000 images in fMRI, up to approximately 10 minutes) unavoidable asymmetry changes that occur during the acquisition series cannot be reacted to dynamically. Given longer echo times in the framework of such series, an intensified dephasing of the nuclear magnetic resonance measurement signal can appear that ultimately severely impairs the quality of the phase correction data.

B) For each image acquisition, a phase correction, scan is acquired immediately after the -excitation pulse but still before the actual (diagnostic) image data acquisition.

The phase correction scan can be an acquisition with at least two adjacent half-waves (with a positive gradient amplitude and a negative gradient amplitude), but typically with three half-waves (+−+ or −+− in order to be able to take into account B0 offset dephasing effects). The information to be evaluated is the displacement both of the position of the echo and the phase of the echo and is used (for example averaged) for correction of the positive and negative gradient pulses of the actual, immediately-following image acquisition. An advantage of this method is that changes can be dynamically reacted to given longer acquisition series and essentially no additional measurement time is incurred (given a readout frequency of approximately 1000 Hz, the duration of each phase correction scan is only approximately 1.5 ms).

A significant disadvantage of this approach is that time-dynamic effects (for example resonance phenomena) that develops during the readout gradient pulse train are not detected.

SUMMARY OF THE INVENTION

An object of the present invention is to provide a method and MRT apparatus that further improve the phase correction in EPI sequences (and therewith reduces the occurrence of Nyquist ghosts) and avoids the aforementioned disadvantages of the existing methods.

This object is achieved according to the present invention by a method for reduction of Nyquist ghosts in medical magnetic resonance imaging in the application of EPI sequences, wherein a data acquisition proceeds with an alternating readout gradient pulse train, and wherein for adjacent positive or negative readout gradient amplitude alternating positive and negative echoes are acquired, and wherein a determination (by measurement, simulation or analytical determination) of one or more progression curves with regard to one or more characterizing quantities of the echo is made, dependent on the echo number of a readout gradient pulse train defined by pulse shape, pulse amplitude and pulse duration, an EPI measurement is implemented with the alternating readout gradient pulse train with phase coding gradients, so a phase-coded data set is acquired, the phase-coded data set is corrected on the basis of the progression curves, curve or the corrected data set is Fourier-transformed, to obtain an artifact-reduced (with regard to the Nyquist ghosts) image data set.

According to the invention a characterizing quantity represents a coefficient of a polynomial of the order n with which the phase of the Fourier-transformation of an echo is approximated.

In an embodiment of the present invention, given an approximation with only the first polynomial coefficient characterizing a phase shift of the echo signal; or only the second coefficient characterizing a phase shift of the echo; or only the first and the second coefficient of the polynomial, are taken into account.

According to the invention the progression curve of one or more characterizing quantities is individually determined for positive and negative echoes, dependent on the echo number.

In an embodiment of the method, one or more progression curves are determined as difference curves that represent the difference of one or more characterizing quantities of successive echoes, dependent on the echo number.

In general it can be advantageous to apply the correction to every other line of the phase-coded data set.

Particularly in the case of a difference curve (but not limited solely thereto) the progression curve can be approximated by an exponential function $a \cdot (1-b \cdot \exp(-T(echo)/c))$, with parameters a, b and c characterizing the function.

By a one-time implementation of the determination step on a phantom, the progression curves are advantageously determined and stored in a one-time adjustment step in the form of a group of progression curves that are relevant with regard to the frequently-used EPI sequences.

The determination of the progression curves on the basis of a measurement can proceed by the application of one or more RF excitation pulses, application of an alternating readout gradient pulse train (characterized by pulse shape, pulse amplitude and pulse interval) without simultaneous application of a phase coding gradient, so a train of echoes is acquired that represent a one-dimensional projection of the Fourier-transformed image data set, and formation of one or more progression curves with regard to one or more characterizing quantities of successive echoes of the acquired echo train.

A different or additional possibility for the determination of the progression curves proceeds by implementation of an EPI measurement with alternating readout gradient pulse train with phase coding gradient, so a phase-coded data set is acquired, Fourier transformation of the uncorrected data set, so an image data set affected by a Nyquist ghost may possibly be acquired, and formation of a progression curve from the image content of the image data set affected by a Nyquist ghost by minimization of the Nyquist ghost.

In the case of the image-based determination, the minimization of the Nyquist ghost can ensue by minimization of an auto-correlation function.

Given deviation of a readout gradient pulse, train to be applied from that of the adjustment step, a significant part of the inventive method is to adapt the respective progression curve of the adjustment step to that of the current specific measurement protocol.

The adaptation can ensue on the basis of the amplitude relationship (ratio) of the Fourier deconstruction of the zero$^{th}$ order of a Fourier deconstruction of the readout gradient pulse trains.

Instead of a progression curve determination in a one-time adjustment step, the progression curves can be determined individually, corresponding to the current readout gradient pulse train, by an independent calibration measurement implemented on the patient.

The inventive method can be combined with a phase correction of all positive and negative echoes on the basis of the correction data set. It is particularly advantageous to combine the inventive method with the method B described in the preceding. In this case, the method B is first applied in the EPI measurement noted above, and afterwards the inventive method is implemented.

The determination of the progression curves also can ensue by a combination of both measurement-based methods, a one-time determination of start values of the progression curves on the basis of a measurement, a simulation or an analytical determination, and an optimization of the progression curves on the basis of image information acquired.

The above object also is achieved in accordance with the present invention by a magnetic resonance tomography apparatus that is operable to implement the above-described method, and all embodiments thereof.

DESCRIPTION OF THE DRAWINGS

FIG. 2 shows different progression curves of positive and negative echoes of an EPI sequence that, for example, lead to an (exponential) difference curve, or in the lower part to a general progression curve of a characterizing quantity in accordance with the invention.

FIG. 4 shows a group of exponentially-adapted difference curves dependent. on the oscillation frequency of the readout gradient pulse train in accordance with the invention.

FIG. 5 shows an EPI image series before (with Nyquist ghosts) and after the correction (without Nyquist ghosts) in accordance with the invention.

FIG. 6A shows the Fourier analysis of two different readout gradient pulse shapes.

FIG. 6B illustrates the pulse sequence-dependent time constants D, R and T in accordance with the invention.

DESCRIPTION OF THE PREFERRED EMBODIMENTS

Figure 1A:
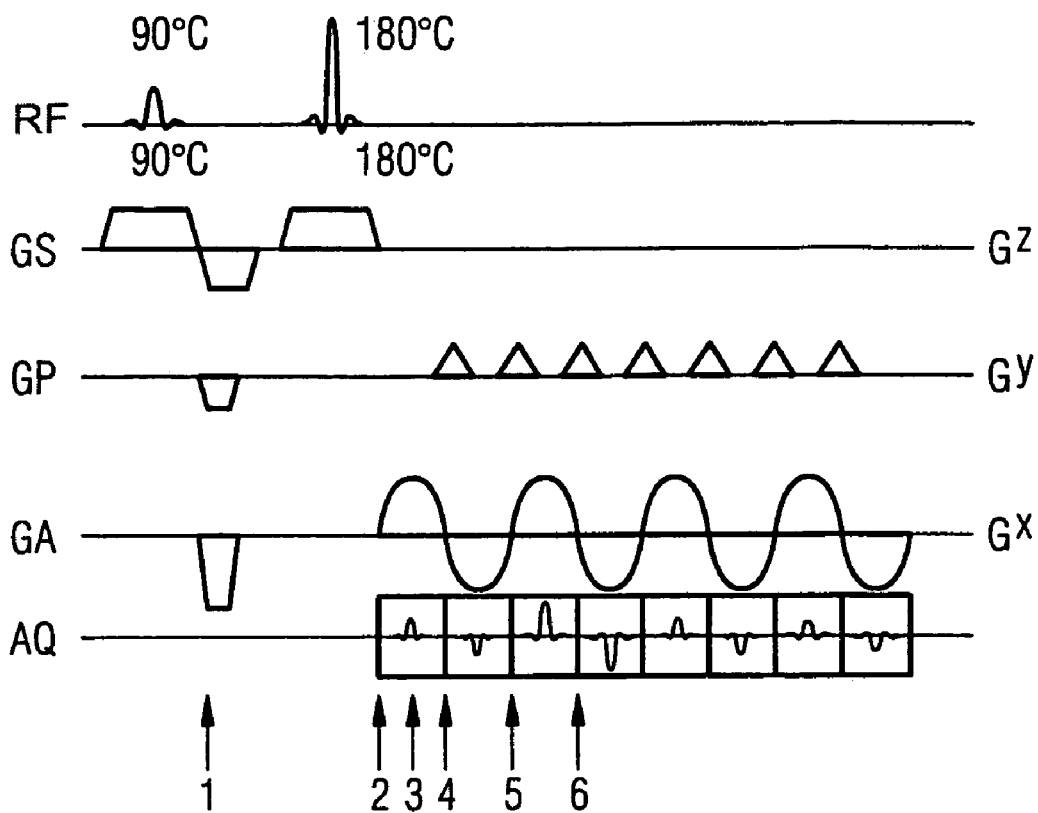
FIG. 1A shows a pulse sequence diagram of a known EPI sequence.
Figure 1B:
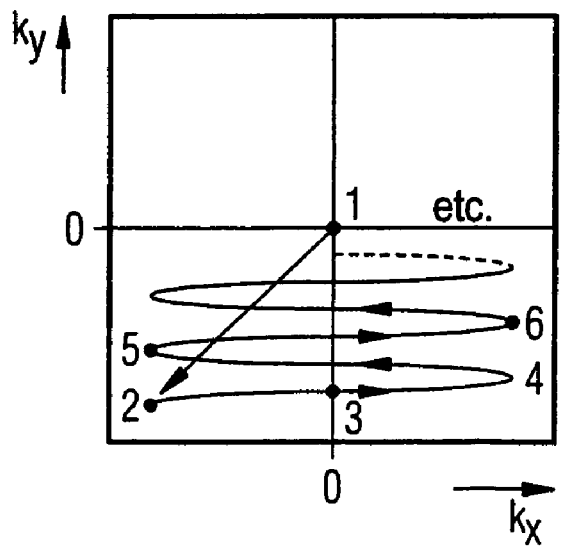
FIG. 1B schematically shows the sampling of the k-matrix for the EPI sequence of FIG. 1A.

The characteristic feature of EPI imaging is the alternating readout gradient pulse train given the data acquisition (FIG. 1A) with which all lines of the k-space matrix are successively acquired in a non-segmented acquisition method (segmented methods and three-dimensional EPI acquisition methods are not considered in the following, but the inventive method can be transferred thereto without further measures). Adjacent lines are thus acquired under inverted gradient amplitudes and must be rectified before the Fourier transformation in order to acquire a correct image data set. The rectification considered is thus not considered as the acquired signal itself.

For abbreviation in the following discussion, the terms "positive echo" and "negative echo" are used for such data sets that are readout with positive and negative readout gradient pulses, respectively, independent of the actual algebraic sign of the k-space coordinates (other typical designations are, for example, "even echo" and "odd echo").

Figure 3:
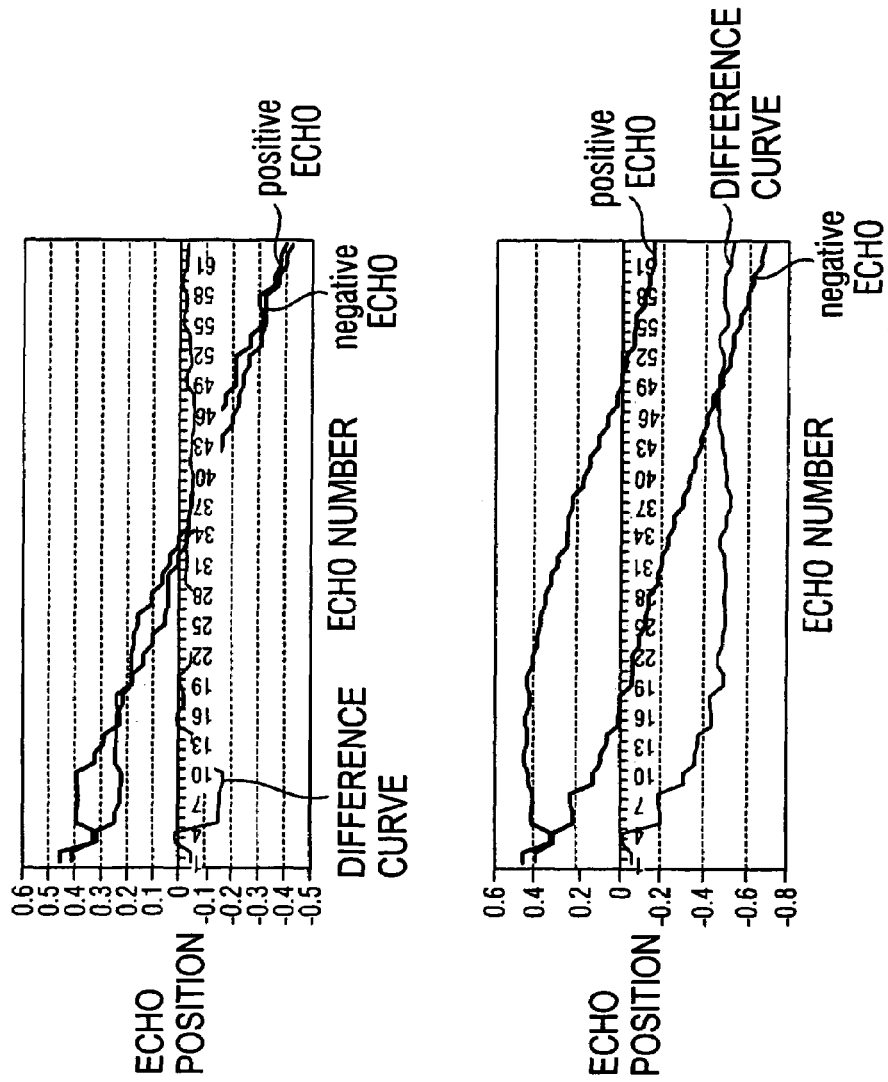
FIG. 3 shows the difference of the progression curves given an EPI measurement without and with Nyquist ghosts in accordance with the invention.
Figure 7:
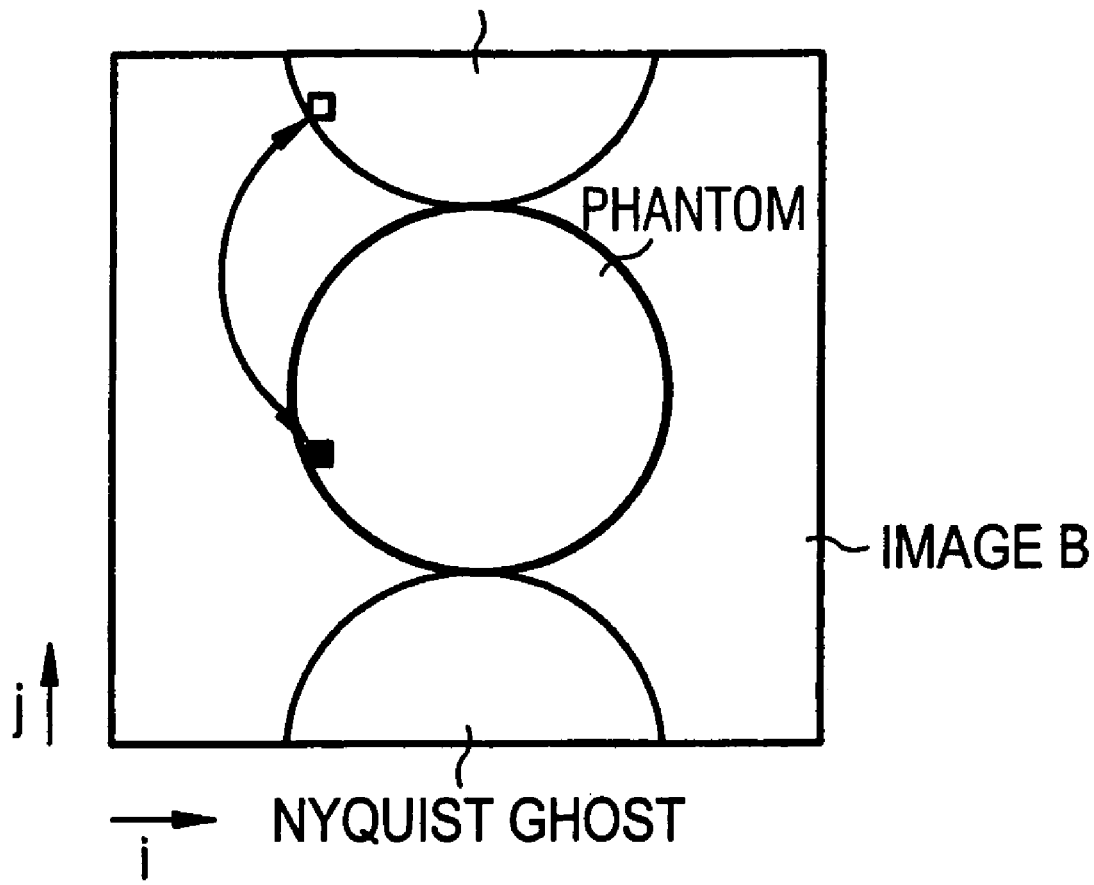
FIG. 7 shows an image-based optimization of a progression curve on the basis of the minimization of an auto-correlation function in accordance with the invention.

As noted above, every influence that leads to an asymmetry of these positive and negative data lines (for example due to eddy currents, system-intrinsic delays, etc.) makes itself noticeable in the occurrence of Nyquist ghosts. Nyquist ghosts are schematically shown in FIG. 7 and actual examples are shown in FIGS. 3 and 5. Phase correction methods for reduction of Nyquist ghosts given EPI imaging have been briefly outlined above (methods A and B), and represent the basis for the inventive method, which is why these methods are first explained again in more detail.

Phase correction methods generally serve to detect inadequacies in a representative measurement (also designated as a "phase correction scan" in the following) in the framework of an MR experiment and to apply the correction information so acquired to all measurements of the following actual image acquisition (designated as an "image scan"). For EPI sequences this results in a (presently still inadequate) limited suppression of Nyquist ghosts. In practice one proceeds according to the following:

1. The acquisition of an echo pulse train ensues without phase coding in the framework of a phase correction scan, however with the same gradient pulse scheme as in the intended (planned) subsequent image scan.

A number J of complex, adjacent echo signals $E_j(t)$ (j=1 . . . J) is thus acquired. (Specifically for method A, J corresponds to the line count of the k-matrix; J=2 applies for method B.)

2. Each echo signal is Fourier-transformed, whereby a respective corresponding phase correction signal $K_j(\omega)$ is acquired in Fourier space (frequency space or, respectively, frequency domain), with $$K_j(\omega)=FFT(E_j(t))=M_j(\omega)\cdot e^{iP_j(\omega)}$$

$M_j(\omega)$ represents the amplification and $P_j(\omega)$ represents the phase of the phase correction signal.

There is presently no indication that system errors have an effect on the amplitude $M_j(\omega)$, such that given a phase correction this is presently considered at the most as a weighting parameter for the phase $P_j(\omega)$.

3. The phase $P_j(\omega)$ experiences a time-dynamic change, for example due to systematic errors in the sequence timing (for example shift of the gradient pulse timing counter to the timing of RF pulses or of data acquisition intervals). An adaptation (possibly weighted with the signal amplitude) of the phase of each phase correction signal therefore ensues with a polynomial of the order N:

$$P_j(\omega)=a_j^0+a_j^1\omega+a_j^2\omega^2+\ldots+a_j^N\omega^N$$

In practice, one can actually achieve only a correction of the order N=1 in which the polynomial coefficient of the zeroth order O reflects a phase shift in the echo signal and the polynomial coefficient of the order 1 reflects a position shift of the echo signal. Higher orders N>1 are echoed in the form of distortions of the echo signal.

4. The implementation of an image scan ensues, whereby given active phase coding the complex image signals $B_k(t)$ (k=1 . . . K) are acquired. An echo signal $E_j$ is uniquely associated with each of these image signals, whereby each echo signal can also be associated with a number of image signals.

5. The image signals are Fourier-transformed:

$$D_k(\omega)=FFT(B_k(t))$$

and subsequently 6. a phase correction is implemented:

$$D_k'(\omega)=D_k(\omega)\cdot e^{-iP_j(\omega)},$$

wherein the polynomial up to the order N is used for $P_j(\omega)$. The negative algebraic sign in the exponent of the exponential function is important.

7. The phase-corrected image signals are transformed back by inverse Fourier transformation ($FFT^{-1}$ ($D_k'(\omega)$)).

8. The image data set is acquired from the phase-corrected image signals by two-dimensional Fourier transformation. Alternatively, the image already Fourier-transformed and completely phase-corrected in one dimension in step 7 can be directly transferred into the image data set by Fourier transformation in the second dimension.

The present invention now (initially) involves in implementing the phase correction for EPI measurements using progression curves that characterize the relation of the echoes relative to one another dependent on the echo number and are determined once given the installation of the MRT apparatus or at maintenance intervals. Among other things, the knowledge of these progression curves has the advantage that time-consuming phase correction scans can be foregone.

The relation of the echoes to one another (and therewith the progression curves) is determined by quantities known as sequence-dependent and apparatus-dependent characterizing quantities that, for example, can be identified with the coefficients of the phase correction polynomial. As already mentioned this can be the phase shift of the echo signals or their position shift, but a progression curve generally describes a combination of characterizing quantities. An example of such combination is the difference of one or more characterizing quantities that is designated in such a case as a difference curve. The apparatus-dependency and sequence-dependency of a specific characterizing quantity curve (a specific progression curve) is taken into account by this progression curve being determined for different sequence schemes that, for example, differ with regard to RF excitation frequency, pulse frequency, pulse shape, pulse amplitude, pulse duration (in particular of the readout gradient pulse train). In clinical imaging, frequently-used parameter settings are selected for different examination conditions. The result is a progression curve group for respective representative EPI measurements that is stored in the computer of the MRT system and can be immediately internally accessed for a diagnostic measurement in order to be able (in contrast to conventional phase-corrected EPI measurements) to forego time-consuming phase correction scans with simultaneous consideration of time-varying dynamic effects (avoidance of the disadvantages of the methods A and B in the prior art).

In general, the inventive method proceeds as follows:

In a first step S1, one or more progression curves are determined (dependent on the echo number) with regard to one or more characterizing quantities of the positive and negative echoes acquired in an EPI experiment via an alternating readout gradient pulse train. The progression curves are in particular characterized by pulse shape, pulse amplitude, pulse duration and pulse frequency of the readout gradient pulse train and are determined via measurement, simulation or analytical determination.

In a second step S2 a conventional EPI measurement ensues with alternating readout gradient pulse train in the presence of a phase coding gradient, so a phase-coded data set is acquired.

In a third step S3, a correction of the phase-coded data set is implemented on the basis of the progression curve(s), after which an artifact-reduced (with regard to Nyquist ghosts) image data set is acquired via Fourier transformation of the corrected data set in a fourth and last step S4.

A characterizing quantity typically is a coefficient of a polynomial of the n-th order with which the phase of the Fourier-transformation of an echo (according to the sketched phase correction method) can be approximated. Since this phase is, among other things, characterized by phase displacement of the echo (coefficient of zeroth order) as well as by echo position shift (coefficient of the first order), the progression curve normally represents the dependency of one of these two quantities (or even, in a more informative form, their additive or subtractive combination) on the echo number.

The progression curve of one or more (combination) characterizing quantities can inventively be individually plotted for positive and negative echoes or even in chronological (natural) order of the echo number.

Three cases of possible progression curves are exemplarily shown in the upper part of FIG. 2:

The upper curve shows the progression of a characterizing quantity of exclusively positive echoes during the acquisition via a defined readout gradient pulse train while the lower curve concerns only negative echoes. A severely jagged progression curve that alternates between upper and lower progression curve results given more general chronological consideration of the echo numbers.

In the middle part of FIG. 2, the same progression curves for positive and negative echoes are shown as in the upper part, whereby the echo position has been exemplarily selected as a characterizing quantity. As in the upper part of FIG. 2, a divergence of the echo position between positive and negative echoes appears that can already be a possible cause for Nyquist ghosts and that clearly increases with the echo number. A reasonable possibility to quantify this artifact-induced divergence is to plot the difference of the respective echo positions of positive and negative echoes as a progression curve. The cause for the exponential curve can be seen by the resonant MRT system being considered as approximating a driven, damped, harmonic oscillator, which allows progression curves to likewise be determined purely calculationally or additionally by simulations or by analytical determination methods. Such considerations and informative examinations are presently the subject of intensive research.

The lower part of FIG. 2 shows how the difference curve from the middle part of FIG. 2 can be used for correction or for adaptation of the echo position curve of the negative echo to that of the positive echo. A newly-determined difference curve with regard to the corrected, adapted echo position curves henceforth represents a constant (in this case the zero line) which shows that Nyquist ghosts are no longer to be expected with regard to the vectorial quantity "echo position shift".

FIG. 3 explains this fact given a frequency F1 of the readout gradient pulse train, a uniform, non-diverging curve of the echo positions of positive and negative echoes exists. The difference curve accordingly, approximately represents the zero line. The reconstructed MRT image of a phantom to the left of the diagram exhibits no Nyquist artifacts whatsoever. However, given a frequency F2 (lower part of FIG. 3) the curve of the echo position of positive echo differs considerably from that of the negative echo, whereby the determined difference curve is clearly different from the zero line and in turn has exponential character. The image to the left of the diagram clearly shows Nyquist ghosts.

Although any number of different types of progression curves can be determined with regard to one or more characterizing quantities, the exponential difference curves represent the most important basis for a phase correction of lower order. In FIG. 4 difference curves are plotted and, respectively, exponentially adapted as a function of the echo number (ECHO) for different frequencies of the readout gradient pulse train, wherein the coefficients a, b and c respectively determine the general function $$a \left( 1 - b \cdot e^{\left( -\frac{ECHO}{c} \right)} \right)$$

and are stored for the respective frequency. The pulse shape of the readout gradient pulse train is identical up to the pulse frequency for all plotted difference curves.

If a corresponding readout gradient pulse train is thus selected in the later conventional EPI measurement operation, a difference curve that corresponds to the readout frequency used forms the basis in advance of this measurement, on which basis the measured, phase-coded data set is still corrected before the actual image display.

As is clear from FIG. 4, the readout frequency in particular has significant influence on relevant characterizing quantities. Specific frequencies cause high divergence, other frequencies cause none at all. This is connected with the fact that primarily mechanical resonances of the MRT system are caused by specific frequencies of the readout gradients, which mechanical resonances build up given an increasing temporal length of the pulse train (see time-dynamic effects in the specification preamble). The upper part of FIG. 5 shows that the pulse shape of the readout gradients also has significant influence on the divergence of characterizing quantities. An image series is shown in which the rise of the ramps of the readout gradient pulse train was varied, which (third image) leads to Nyquist ghosts and is to be corrected. Given knowledge of a corresponding progression curve (for example by determination of one of the curve groups corresponding to FIG. 4 dependent on the pulse shape ramp variation), this ghost can likewise be completely eliminated corresponding to the lower image line.

A progression curve group according to FIG. 4 understandably cannot be determined for every parameter configuration of all EPI sequence schemes. The effort would be too great due to the large number of combinations. For this reason one is limited to parameter adjustments of frequently-used EPI sequences and (with regard to each of these adjustments in the framework of a one-time adjustment step upon installation of the apparatus or at maintenance intervals) measures relevant progression curve groups that are then internally provided to the system or image computer for image or phase correction.

In the further measurement operation the case can thus occur as a result of readout gradient pulse trains being used that notably deviate from the pulse trains used in the adjustment step and for which no specified progression curve groups therefore exist in the computer. In this case, however, it is inventively possible to report to a second readout gradient pulse train similar to the current pulse train used in the framework of the adjustment step, to scale the progression curves present for this second readout gradient pulse train and to use these for the correction. The scaling inventively ensues on the basis of the amplitude ratios of the Fourier coefficients of both pulse trains. In order to determine this, according to FIG. 6A a Fourier analysis is implemented for both pulse trains (current pulse train and second pulse train) and the amplitudes of the respective Fourier components are determined.

The quantities characteristic for the pulse shape (such as pulse height A, pulse interval D, rise time R and pulse duration T (see FIG. 6B) are normally already reflected in the first Fourier coefficients with regard to the base frequency $f_0$ or, respectively, $f_0'$, such that only the corresponding amplitude ratio $a_1'/a_1$ is to be determined for the scaling itself. For example, a calculation rule for the amplitude $a_1$ of the Fourier coefficients of the first order reads:

$$a_1 = 2A \cdot \frac{t}{\pi^2} \left[ \frac{-\sin\left(\frac{\pi t_2}{t}\right) - \sin\left(\frac{\pi t_1}{t}\right)}{t_2 - t_1} - \frac{\sin\left(\frac{\pi t_4}{t}\right) - \sin\left(\frac{\pi t_3}{t}\right)}{t_4 - t_3} \right],$$

wherein (see FIG. 6B):

$t1 = D/2$ $t2 = D/2 + R$ $t3 = D/2 + R + T$, $t4 = D/2 + 2R + T$ and $t = D + 2R + T/$ Given the assumption of an exponential progression curve (for example in the case of a difference curve of the form $$a\left(1 - b \cdot e^{\left(-\frac{ECHO}{c}\right)}\right),$$

it is generally sufficient to scale the parameter a with the ratio of the amplitudes of the Fourier coefficients of the first order.

The determination of the progression curves on the basis of a measurement (for example in the adjustment step) can ensue in a different manner:

i) According to the method A in the prior art, an echo train is acquired via application of an alternating readout gradient pulse train without phase coding, which echo train represents a one-dimensional projection of the subject and on the basis of which one or more progression curves are formed with regard to one or more characterizing quantities of the successive echo of the acquired echo train.

ii) Another possibility is to form the progression curve from the image content of an already-measured, Nyquist ghost-afflicted image data set, in that the minimization of the Nyquist ghost is correlated with a function characterizing the image. According to the invention, this can ensue on the basis of an auto-correlation function $$A = \sum_i^N \sum_j^N \begin{cases} B[i,j] \cdot B\left[i, j + \frac{N}{2}\right] & \text{for } j + \frac{N}{2} \leq N \\ B[i,j] \cdot B\left[i, j - \frac{N}{2}\right] & \text{otherwise} \end{cases}$$

as is illustrated in FIG. 7.

In the context of an optimization, the Nyquist ghost-afflicted image B is calculated with various parameters of phase correction (for example a, b, c of the exponential difference curve) and the associated auto-correlation function A (which could also be designated as a cost function in this context) is similarly determined. The parameters are varied (for example via a simplex minimization method) such that A is minimal. Clearly spoken, a summation of the product of the image amplitude at the position [i, j] with that at the position [i, j±N/2] is implemented dependent on the parameters a, b, c. Without the presence of a Nyquist ghost, the sum expression A would be minimal, meaning the values would be uncorrelated. Given a correlation, meaning when a Nyquist ghost appears, the value of this sum will be greater. A minimal sum value A accordingly means a Nyquist ghost-free, optimized image.

iii) The two methods from i) and ii) can be combined by determining start values of a progression curve in the first step S1 on the basis of a measurement according to i) (or on the basis of a simulation or analytical determination) and an optimization of the progression curve subsequently ensues on the basis of image information acquired according to ii).

It should also be noted that the progression curves individually corresponding to the current sequence scheme (and therewith to the current readout gradient pulse train) can be determined by an independent calibration measurement implemented at the patient, and thus stored progression curves can be foregone.

This results in a distinct measurement time extension, but achieves a more exact image correction.

In summary, the inventive method has the following advantages relative to the prior art (methods (A), (B)):

1) Given a longer acquisition series, changes can be reacted to during the acquisition.
2) No additional measurement time is required since the progression curves are determined in a one-time adjustment step upon installation or maintenance.
3) Effects are detected that only build up dynamically over time during the EPI readout pulse train (for example resonance phenomena).
4) The determination of correction data ensues at the phantom, which is why no relevant dephasing effects occur; with regard to the data quality these are sufficient for the correction.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for reducing Nyquist ghosts in a tomographic image acquired by magnetic resonance imaging, comprising the steps of:
   (S1) for an EPI magnetic resonance imaging pulse sequence comprising a readout gradient pulse train defined as to pulse shape, pulse amplitude and pulse duration, under which echo signals are respectively readout, said echo signals having echo numbers respectively associated therewith that increase with increasing time, determining at least one progressive curve for at least one characterizing quantity of the respective echo signals dependent on the echo number thereof;
   (S2) subjecting an examination subject to a diagnostic EPI pulse sequence comprising a readout gradient pulse train comprised of gradient pulses of alternating polarity with a simultaneously activated phase coding gradient, to acquire diagnostic phase-coded magnetic resonance data;
   (S3) correcting said phase-coded diagnostic data using said at least one progression curve, to obtain a corrected diagnostic data set; and
   (S4) Fourier transforming said corrected diagnostic data set to obtain an image data set with reduced Nyquist ghost artifacts.

2. A method as claimed in claim 1 comprising using, as said characterizing quantity, at least one coefficient of an $n^{th}$ order polynomial that approximates a phase of a Fourier-transformed echo signal.

3. A method as claimed in claim 2 comprising selecting said at least one coefficient from the group consisting of only a first coefficient of said polynomial, that characterizes a phase shift of the echo signal, only a second coefficient of the polynomial, that characterizes a phase shift of the echo signal, and only a first coefficient and a second coefficient of the polynomial.

4. A method as claimed in claim 1 wherein step (S1) comprises determining a progression curve of said at least one characterizing quantity for positive and negative echoes, dependent on said echo number.

5. A method as claimed in claim 1 wherein step (S1) comprises determining a progression curve of said at least one characterizing quantity as a different curve, representing a difference of said at least one characterizing quantity of successive echo signals, dependent on said echo number.

6. A method as claimed in claim 1 wherein said phase-coded data set comprises a plurality of data lines, and wherein step (S3) comprises correcting every other data line of said phase-coded data set.

7. A method as claimed in claim 1 wherein step (S1) comprises determining said progression curve as an approximation of said characterizing quantity by an exponential function $$a\left(1 - b \cdot e^{\left(-\frac{ECHO}{c}\right)}\right)$$

wherein ECHO is the echo number, and a, b and c are constants.

8. A method as claimed in claim 1 wherein step (S1) comprises subjecting a phantom to a plurality of different EPI sequences, and for each of said EPI sequences, determining said at least one progression curve for said at least one characterizing quantity, to obtain a group of progression curves, and storing said group of progression curves, and wherein step (S2) comprises subjecting said examination subject to one of said plurality of EPI sequences, as said diagnostic EPI sequence, and wherein step (S3) comprises selecting the at least one progression curve from said group of progression curves for the EPI sequence in step (S1) that corresponds to the diagnostic EPI sequence used in step (S2) to correct the phase-coded diagnostic data set in step (S3).

9. A method as claimed in claim 8 comprising, if the readout gradient pulse train used in step (S1) to determine said at least one progression curve deviates from the readout gradient pulse train used in said diagnostic EPI sequence in step (S2), adapting said at least one progression curve to the readout gradient pulse train used in step (S2).

10. A method as claimed in claim 9 comprising adapting said at least one progression curve based on an amplitude ratio of perspective Fourier components of the zeroth order of a Fourier deconstruction of the respective readout gradient pulse trains.

11. A method as claimed in claim 1 wherein step (S1) comprises:
    emitting at least one RF excitation pulse;
    activating a readout gradient pulse train comprising successive gradient pulses of alternating polarity, with a predetermined pulse shape, pulse amplitude and pulse interval, without simultaneous activation of a phase coding gradient, to obtain a train of echo signals representing a one-dimensional projection of the Fourier-transformed image data set; and
    forming said at least one progression curve for said at least one characterizing quantity of successive echoes of said train of echoes.

12. A method as claimed in claim 1 wherein step (S1) comprises:
    subjecting an examination object to an EPI sequence comprising a readout gradient pulse train comprising successive gradient pulses of alternating polarity with a simultaneously activated phase coding gradient, to obtain an initial phase-coded data set;
    Fourier transforming said initial phase-coded data set, to obtain an initial image data set in which Nyquist ghost artifacts may be present; and
    forming said at least one progression curve from an image content of said image data set to minimize said Nyquist ghost artifacts therein.

13. A method as claimed in claim 12 comprising minimizing said Nyquist ghost artifacts in said initial image data set using an auto-correlation function.

14. A method as claimed in claim 12 comprising, if the readout gradient pulse train used in step (S1) to determine said at least one progression curve deviates from the readout gradient pulse train used in said diagnostic FRI sequence in step (S2), adapting said at least one progression curve to the readout gradient pulse train used in step (S2).

15. A method as claimed in claim 14 comprising adapting said at least one progression curve based on an amplitude ratio of perspective Fourier components of the zeroth order of a Fourier deconstruction of the respective readout gradient pulse trains.

16. A method as claimed in claim 1 comprising determining said at least one progression curve in step (S1) in a calibration measurement by subjecting said examination subject to said EPI sequence in step (S1).

17. A method as claimed in claim 1 wherein said echo signals comprise positive and negative echoes and comprising making an additional phase correction of all positive and negative echoes using a phase correction data set.

18. A method as claimed in claim 1 comprising determining said at least one progression curve by a one-time determination of start values of said at least one progression curve by a determination selected from the group consisting of a measurement, a simulation, and an analytical determination, and optimizing said at least one progression curve by subjecting an examination object to an EPI sequence comprising a readout gradient pulse train comprising successive gradient pulses of alternating polarity with a simultaneously activated phase coding gradient, to obtain an initial phase-coded data set, Fourier transforming said initial phase-coded data set, to obtain an initial image data set in which Nyquist ghost artifacts may be present, and forming said at least one progression curve from an image content of said image data set to minimize said Nyquist ghost artifacts therein.

19. A magnetic resonance tomography apparatus comprising:

a computer having access to at least one progression curve for an EPI magnetic resonance imaging pulse sequence, said EPI sequence comprising a readout gradient pulse train defined as to pulse shape, pulse amplitude and pulse duration, under which echo signals are respectively readout, said echo signals having echo numbers respectively associated therewith that increase with increasing time, said at least one progressive curve representing at least one characterizing quantity of the respective echo signals dependent on the echo number thereof;

a magnetic resonance scanner adapted to interact with an examination subject;

a sequence controller that operates said magnetic resonance scanner to subject the examination subject to a diagnostic EPI pulse sequence comprising a readout gradient pulse train comprised of gradient pulses of alternating polarity with a simultaneously activated phase coding gradient, to acquire diagnostic phase-coded magnetic resonance data; and said computer correcting said phase-coded diagnostic data using said at least one progression curve, to obtain a corrected diagnostic data set, and Fourier transforming said corrected diagnostic data set to obtain an image data set with reduced Nyquist ghost artifacts.

* * * * *